United States Patent
Hung et al.

(10) Patent No.: US 12,273,037 B2
(45) Date of Patent: Apr. 8, 2025

(54) ELECTRONIC DEVICE AND DRIVING CIRCUIT THEREOF

(71) Applicant: Novatek Microelectronics Corp., Hsinchu (TW)

(72) Inventors: Sheng-Hsi Hung, Taoyuan (TW); Yen-Ching Lin, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 308 days.

(21) Appl. No.: 17/852,392

(22) Filed: Jun. 29, 2022

(65) Prior Publication Data

US 2024/0007004 A1 Jan. 4, 2024

(51) Int. Cl.
*H02M 3/335* (2006.01)
*H02M 1/08* (2006.01)
*H02M 1/42* (2007.01)

(52) U.S. Cl.
CPC ......... *H02M 3/33569* (2013.01); *H02M 1/08* (2013.01); *H02M 1/4208* (2013.01)

(58) Field of Classification Search
CPC ... H02M 3/33569; H02M 1/08; H03K 17/223
See application file for complete search history.

(56) References Cited

U.S. PATENT DOCUMENTS

| | | | |
|---|---|---|---|
| 6,229,356 B1* | 5/2001 | Miettinen | H03K 17/567 327/108 |
| 9,787,302 B2 | 10/2017 | Deng et al. | |
| 11,165,423 B2 | 11/2021 | Ye et al. | |
| 11,611,339 B2 | 3/2023 | Ye et al. | |
| 11,909,384 B2* | 2/2024 | Chen | H03K 17/223 |
| 2016/0172961 A1* | 6/2016 | Deng | H02M 3/158 327/109 |
| 2020/0099376 A1 | 3/2020 | Rinne et al. | |
| 2021/0028782 A1 | 1/2021 | Ye et al. | |
| 2022/0069817 A1 | 3/2022 | Ye et al. | |
| 2023/0038798 A1* | 2/2023 | Lueders | H03K 17/16 |

FOREIGN PATENT DOCUMENTS

WO 2020029540 2/2020

OTHER PUBLICATIONS

"Office Action of Taiwan Counterpart Application", issued on Mar. 14, 2023, p. 1-p. 5.

* cited by examiner

*Primary Examiner* — Kyle J Moody
(74) *Attorney, Agent, or Firm* — JCIPRNET (57) ABSTRACT

A driving circuit includes a first driving signal generator, a first voltage conversion circuit and a first switch. The first driving signal generator generates a first driving signal according a first input signal, wherein the first driving signal is a pulse width modulated signal. The first voltage conversion circuit is coupled between the first driving signal generator and a control terminal of a first power transistor, converts the first driving signal to an output driving signal by charges a capacitor and discharges the capacitor, wherein the output driving signal is output to the control terminal of the first power transistor. The first switch is couple with the first power transistor in series, and is controlled by a control signal to be turned-on or cut-off.

10 Claims, 13 Drawing Sheets

ELECTRONIC DEVICE AND DRIVING CIRCUIT THEREOF

BACKGROUND

Field of the Invention

The invention relates to an electronic device and a driving circuit thereof, and more particularly, to the driving circuit for providing a driving signal with negative voltage pulses to turn-on or cut-off a power transistor.

Description of Related Art

In recent years, a third-generation transistor is provided, and is widely used in power conversion application. The third-generation transistor, such as a GaN transistor or a SiC transistor, has a better FOM (Figure of merit), lower prim cost for manufacture and more suppliers. But, since the third-generation transistor is a constant on device, and an extra switch is always needed to cut-off a path form by the third-generation transistor. Such as that, a control scheme for the third-generation transistor is complex and cause higher design cost.

SUMMARY

The invention provides an electronic device and a driving circuit thereof, where the driving circuit is configured to provide a driving signal with negative voltage pulses to control a power transistor.

According to an embodiment of the invention, the driving circuit includes a first driving signal generator, a first voltage conversion circuit and a first switch. The first driving signal generator generates a first driving signal according a first input signal, wherein the first driving signal is a pulse width modulated signal. The first voltage conversion circuit is coupled between the first driving signal generator and a control terminal of a first power transistor, converts the first driving signal to an output driving signal by charges a capacitor and discharges the capacitor, wherein the output driving signal is output to the control terminal of the first power transistor. The first switch is couple with the first power transistor in series, and is controlled by a control signal to be turned-on or cut-off.

According to another embodiment of the invention, the electronic device includes a core circuit and at least one driving circuit. The core circuit includes a first power transistor. The first driving signal generator generates a first driving signal according a first input signal, wherein the first driving signal is a pulse width modulated signal. The first voltage conversion circuit is coupled between the first driving signal generator and a control terminal of a first power transistor, converts the first driving signal to an output driving signal by charges a capacitor and discharges the capacitor, wherein the output driving signal is output to the control terminal of the first power transistor. The first switch is couple with the first power transistor in series, and is controlled by a control signal to be turned-on or cut-off.

To sum up, the driving circuit of present disclosure provides the voltage conversion circuit to convert a positive voltage pulse of the driving signal to a negative voltage pulse of the output signal. The negative voltage pulse of the output signal can be applied to a control terminal of the power transistor, and the power transistor can be cut-off efficiency.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

Figure 1:
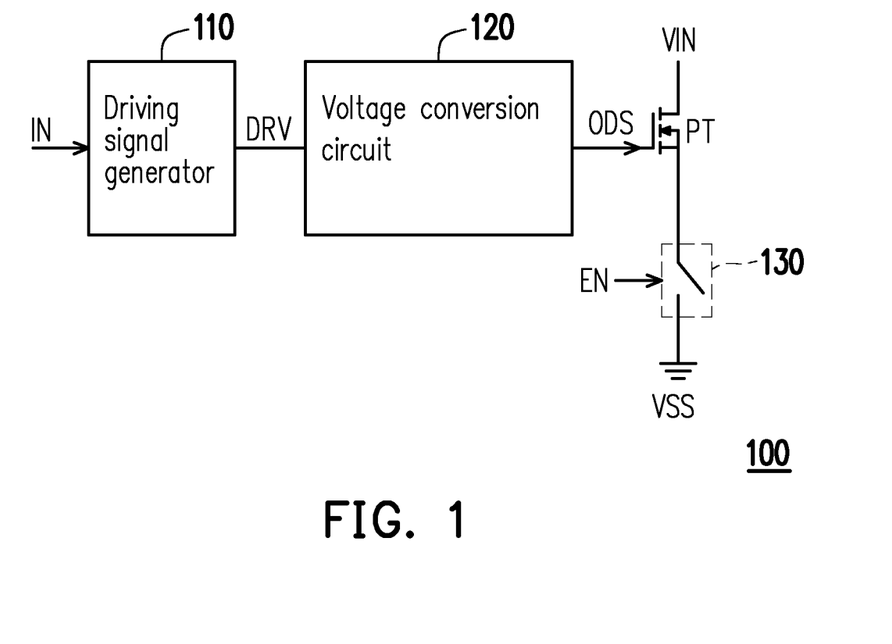
FIG. 1 illustrates a schematic diagram of a driving circuit according to an embodiment of present disclosure.

Please refer to FIG. 1, which illustrates a schematic diagram of a driving circuit according to an embodiment of present disclosure. The driving circuit 100 includes a driving signal generator 110, a voltage conversion circuit 120 and a switch 130. The driving signal generator 110 generates a driving signal DRV according an input signal IN. In this embodiment, the input signal IN may be a pulse width modulated (PWM) signal, and the driving signal DRV is also a PWM signal, too.

The voltage conversion circuit 120 is coupled to the driving signal generator 110 and a power transistor PT. The voltage conversion circuit 120 receives the driving signal DRV, and converts the driving signal DRV to generate an output driving signal ODS to a control terminal of the power transistor PT. In this embodiment, the power transistor PT may be a third-generation transistor, such as GaN or SiC transistor. In detail, the voltage conversion circuit 120 converts the driving signal DRV by charging a capacitor when the driving signal DRV is at a first voltage and discharging the capacitor when the driving signal DRV is at a second voltage to generate the output driving signal ODS, where the first voltage level may be higher than the second voltage level. In this embodiment, the output driving signal ODS may transited to a negative voltage when the driving signal DRV is transited from the first voltage to the second voltage, and the output driving signal ODS may be held on the negative voltage when the driving signal DRV is held on the second voltage.

The switch 130 is coupled with the first power transistor PT between a receiving power VIN and a reference ground power VSS in series, and a control end of the switch 130 receives an enable signal EN. The switch 130 can be turned-on or cut-off according to the enable signal EN.

In detail, the power transistor PT is a constant-on transistor. When the power transistor PT is in a standby state, the switch 130 may be cut-off according to the enable signal EN, and when the power transistor PT is in an operation state, the switch 130 may be turned-on according to the enable signal EN. In the operation state, the driving signal generator 110 may receive the input signal IN which is pulse width modulation (PWM) signal, and generate a driving signal DRV according to the input signal IN, and the driving signal DRV is also PWM signal, too.

In the operation state, the voltage conversion circuit 120 may converts the driving signal DRV to generate the output driving signal ODS. In this embodiment, since the driving signal DRV is PWM signal, the driving signal DRV may be transited between the first voltage and the second voltage alternatively. The voltage conversion circuit 120 may generate the output driving signal ODS according to voltage transitions of the driving signal DRV, and the output driving signal ODS is also PWM signal. In detail, the output driving signal ODS is at a third voltage when the driving signal DRV is at the first voltage, and the output driving signal ODS is at the negative voltage when the driving signal DRV is at the second voltage. The third voltage may be a positive voltage.

It can be seen, if the output driving signal ODS is at the negative voltage, the power transistor PT can be cut-off, and if the output driving signal ODS is at the third voltage, the power transistor PT can be turned-on. Such as that, according to the input signal IN, the power switch PT can be turned-on and cut-off, alternatively.

Figure 2:
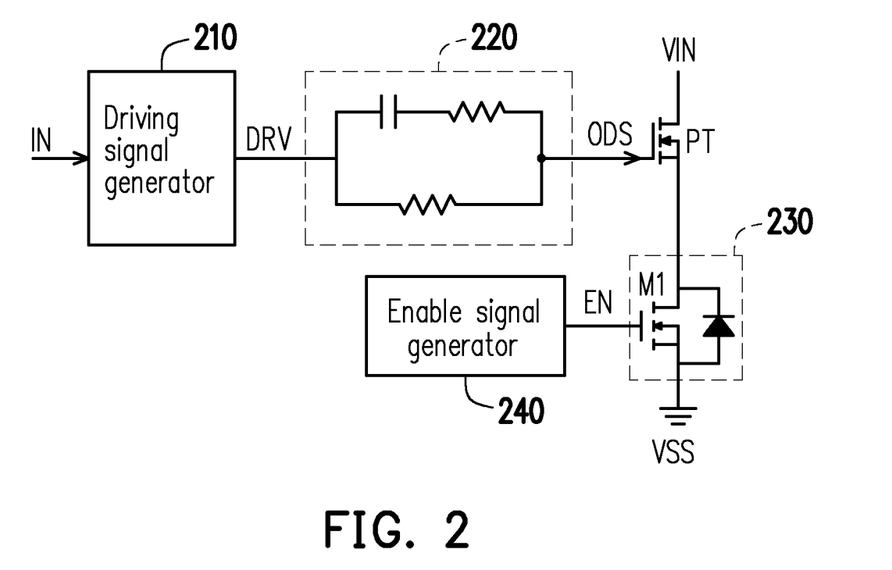
FIG. 2 illustrates a schematic diagram of a driving circuit according to another embodiment of present disclosure.

Please refer to FIG. 2, which illustrates a schematic diagram of a driving circuit according to another embodiment of present disclosure. The driving circuit 200 includes a driving signal generator 210, a voltage conversion circuit 220, a switch 230 and an enable signal generator 240. The driving signal generator 210 generates a driving signal DRV according an input signal IN. The voltage conversion circuit 220 converts the driving signal DRV to generate an output driving signal ODS. The output driving signal ODS is provided to a control terminal of the power transistor PT to turn-on or cut-off the power transistor PT. The enable signal generator 240 is coupled to a control end of the switch 230, and provides an enable signal EN to turn-on or cut-off the switch 230.

In this embodiment, the voltage conversion circuit 220 includes a capacitor C1 and two resistors R1 and R2. The capacitor C1 and the resistor R1 are coupled in series to form a resistor and capacitor (RC) string between the driving signal generator 210 and the control terminal of the power transistor PT. The resistor R2 is coupled between the driving signal generator 210 and the control terminal of the power transistor PT, too, and the resistor R2 is coupled with the RC string in parallel. The capacitor C1 may be disposed outsides an integrated circuit where the resistors R1 and R2 are disposed in.

Figure 3A:
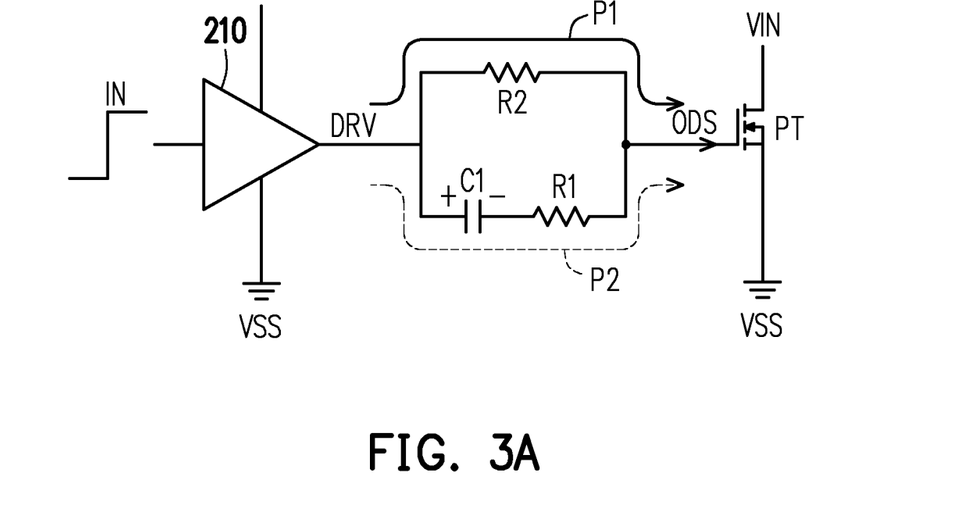
FIG. 3A and FIG. 3C illustrate equivalent circuit diagrams of the driving circuit 200 according to an embodiment of present disclosure.
Figure 3B:
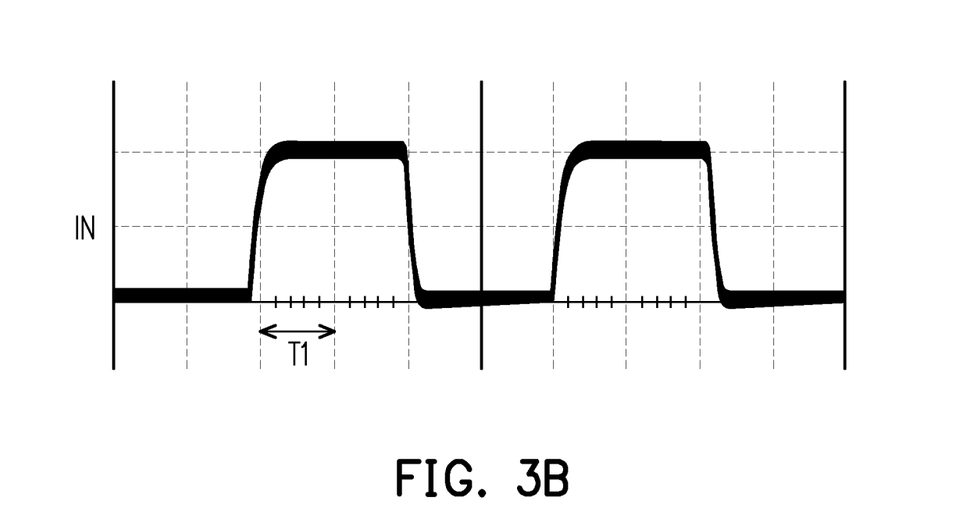
FIG. 3B and FIG. 3D illustrate waveform plots of the driving circuit 200 according to an embodiment of present disclosure.
Figure 3C:
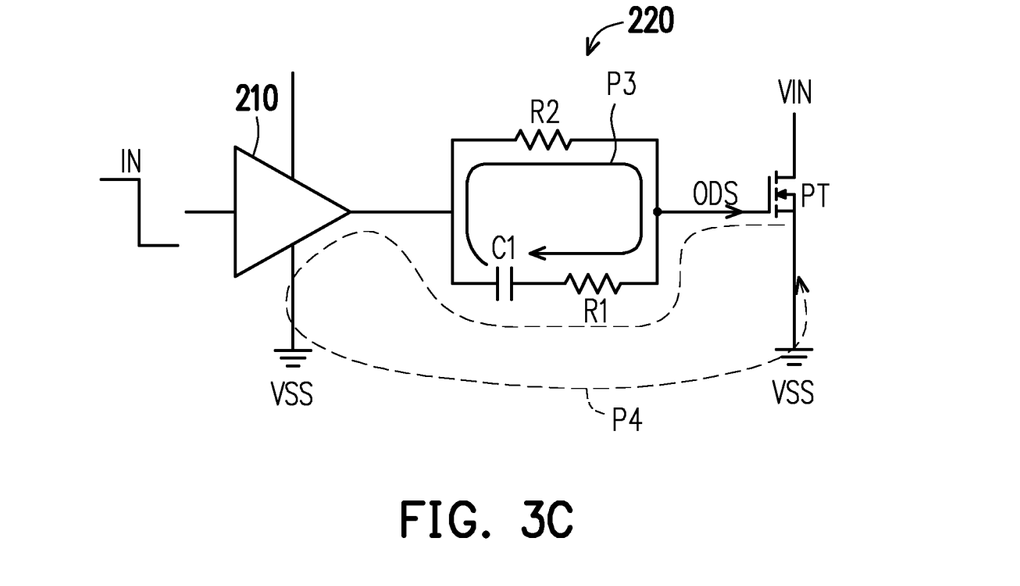
Figure 3D:
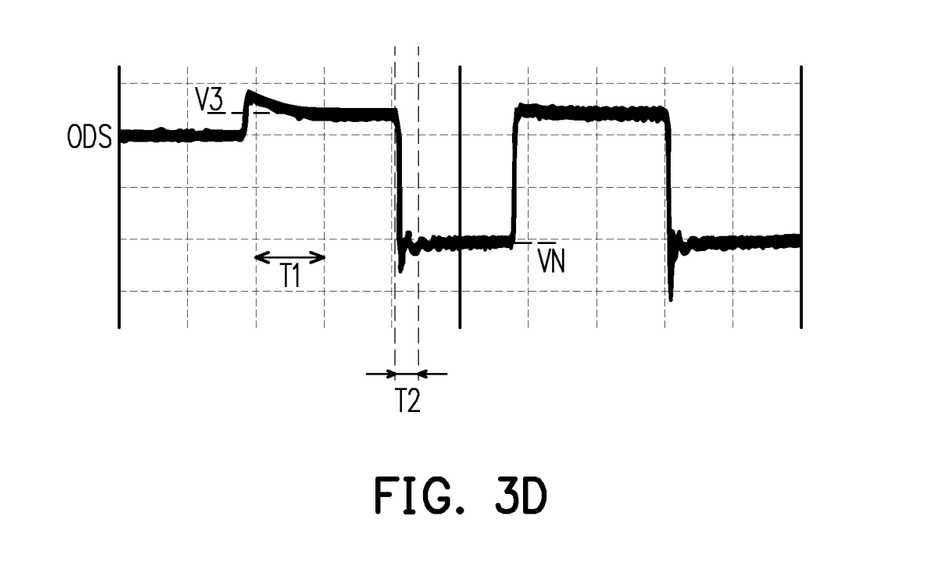

In this embodiment, the voltage conversion circuit 220 converts the driving signal DRV by charging and discharging the capacitor C1. In detail, please refer to FIG. 3A to FIG. 3D, wherein FIG. 3A and FIG. 3C illustrate equivalent circuit diagrams of the driving circuit 200 according to an embodiment of present disclosure, and FIG. 3B and FIG. 3D illustrate waveform plots of the driving circuit 200 according to an embodiment of present disclosure. In FIG. 3A, the driving signal generator 210 receives the input signal IN which is transited from a low voltage to a high voltage, and the driving signal generator 210 may generate the driving signal DRV transited from a first voltage to a second voltage corresponding to a transition of the input signal IN, where the first voltage is lower than the second voltage. Refer to FIG. 3B, during a time period T1, the driving signal generator 210 may charge the capacitor C1 through a charging path P2, and charge a parasitic capacitor on the control terminal of the power transistor PT through a charge path P1. By referring to FIG. 3D, during the time period T1, the voltage conversion circuit 220 may raise up a voltage level of the output driving signal ODS according to a rising edge of the input signal IN. The voltage of the output driving signal ODS may be held at a third voltage V3 when the input signal IN is held on the high voltage.

By referring to FIG. 3C and FIG. 3D, when the input signal IN is transited from the high voltage to the low voltage, the driving signal DRV transited from the second voltage to the first voltage during a time period T2 correspondingly. During the time period T2, a discharging operation can be performed on the capacitor C1 through discharge paths P3 and P4, and the output driving signal ODS can be transited from the third voltage V3 to a negative voltage VN. Such as that, the power transistor PT can be cut-off according to the output driving signal ODS.

Please refer to FIG. 2 again, the switch 230 may be implemented by a transistor M1. The transistor M1 may be a metal-oxide-semiconductor field-effect transistor (MOSFET) in this embodiment. In other embodiments, the transistor M1 may be any type of transistor well known by a person skilled in the art, and no special limitation here.

Figure 4:
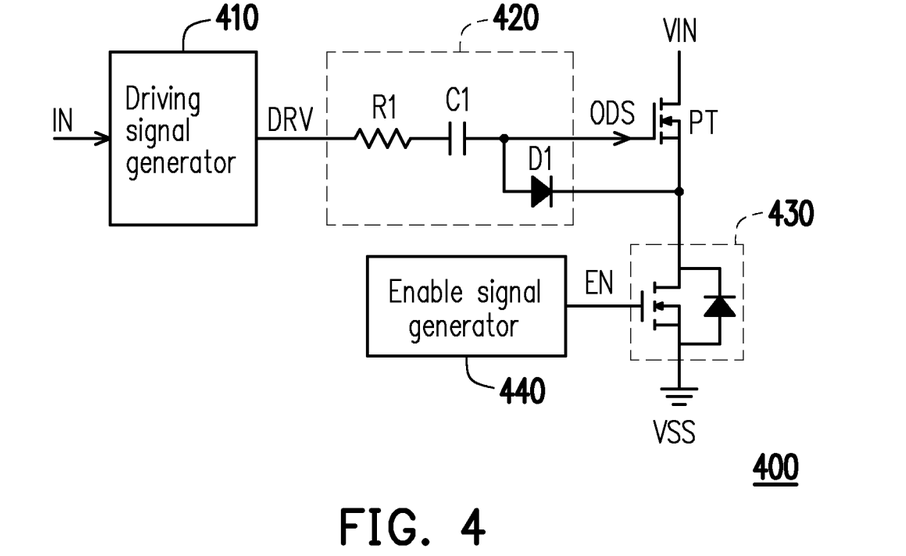
FIG. 4 to FIG. 9 illustrates schematic diagrams of driving circuit according to other embodiments of present disclosure.

Please refer to FIG. 4, which illustrates a schematic diagram of a driving circuit according to an embodiment of present disclosure. The driving circuit 400 includes a driving signal generator 410, a voltage conversion circuit 420, a switch 430 and an enable signal generator 440. The driving signal generator 410 receives an input signal IN which is a PWM signal and generates a driving signal DRV according to the input signal IN. The voltage conversion circuit 420 generates an output driving signal ODS according to the driving signal DRY. In this embodiment, different from the driving circuit 200, the voltage conversion circuit 420 includes a resistor R1, a capacitor C1 and a diode D1. The resistor R1 and the capacitor C1 are coupled between the driving signal generator 410 and a control terminal of the power transistor PT. An anode of the diode D1 is coupled to the control terminal of the power transistor PT, and a cathode of the diode D1 is coupled to a coupling end of the power transistor PT and the switch 430.

In detail operation, corresponding to a rising edge of the driving signal DRV, the voltage conversion circuit 420 performs a charging operation on the capacitor C1. Then, corresponding to a falling edge of the driving signal DRV, the voltage conversion circuit 420 may perform a discharging operation on the capacitor C1, and the output driving signal ODS may be pulled to a negative voltage correspondingly. Such as that, the power transistor PT can be cut-off.

Figure 5:
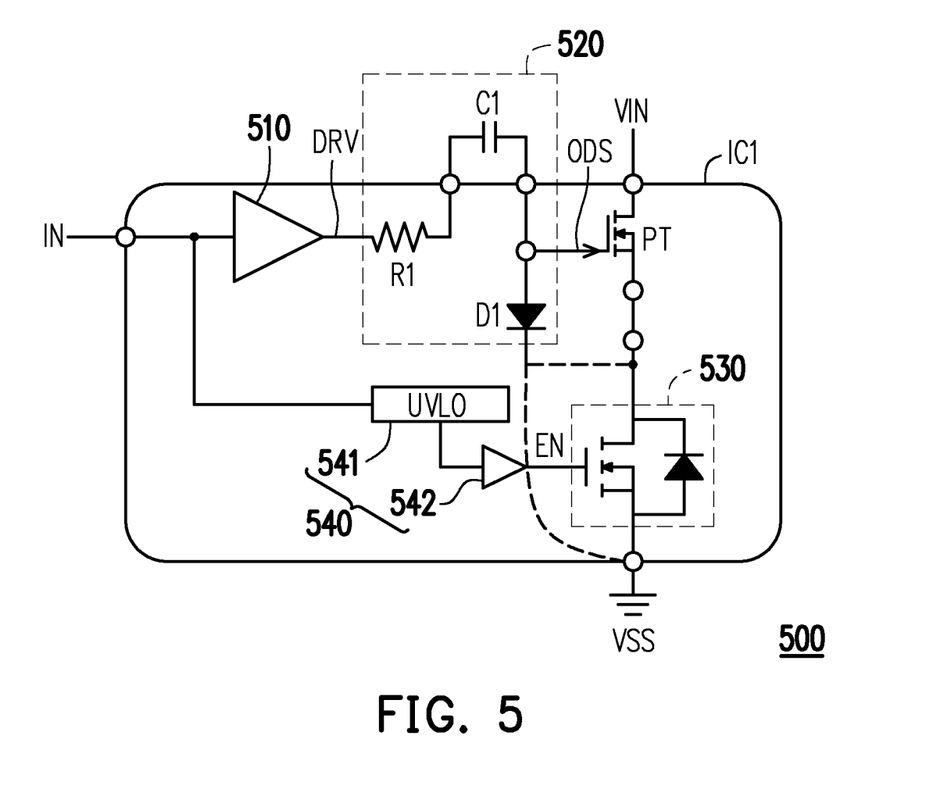

Please refer to FIG. 5, which illustrates a schematic diagram of a driving circuit according to another embodiment of present disclosure. The driving circuit 500 includes a driving signal generator 510, a voltage conversion circuit 520, a switch 530 and an enable signal generator 540. The voltage conversion circuit 520 includes a resistor R1, a capacitor C1 and a diode D1. A circuit structure of the driving circuit 500 is similar to the circuit structure of the driving circuit 400, and detail operation of the voltage conversion circuit 520 is not repeated described here.

Please be noted here, in this embodiment, the driving signal generator 510, the resistor R1, the diode D1, the switch 530, the power transistor PT and the enable signal generator 540 may be disposed in a same integrated circuit IC1. The capacitor C1 may disposed external from the integrated circuit IC1. Furthermore, two ends of the capacitor C1 may be respectively coupled to the resistor R1 and a control terminal of the power transistor PT through two different pads of the integrated circuit IC1. By external disposing the capacitor C1, a chip size of the integrated circuit IC1 can be reduced.

Of course, in some embodiment, the capacitor C1 may be disposed embedded in the integrated circuit IC1 according to a design choice of a designer.

On the other hand, the enable signal generator 540 includes a undervoltage-lockout (UVLO) circuit 541 and a buffer 542. The UVLO circuit 541 receives the input signal IN and decides whether the driving circuit 500 is in a standby state or not by detecting a voltage level of the input signal IN is abnormal or not. If the input signal IN is at an undervoltage status, the enable signal generator 540 may generate the enable signal EN to cut-off the switch 430. On the contrary, if the input signal IN is at a normal status, the enable signal generator 540 may generate the enable signal EN to turn-on the switch 430.

It should be noted here, in this embodiment, a cathode of the diode D1 may be coupled to a coupling end of the power transistor PT and the switch 530. Or, the cathode of the diode D1 may be coupled to the reference ground voltage VSS, too.

The driving signal generator 510 may be any type of driving buffer well know by a person skilled in this art, and no more special limitation here.

Figure 6:
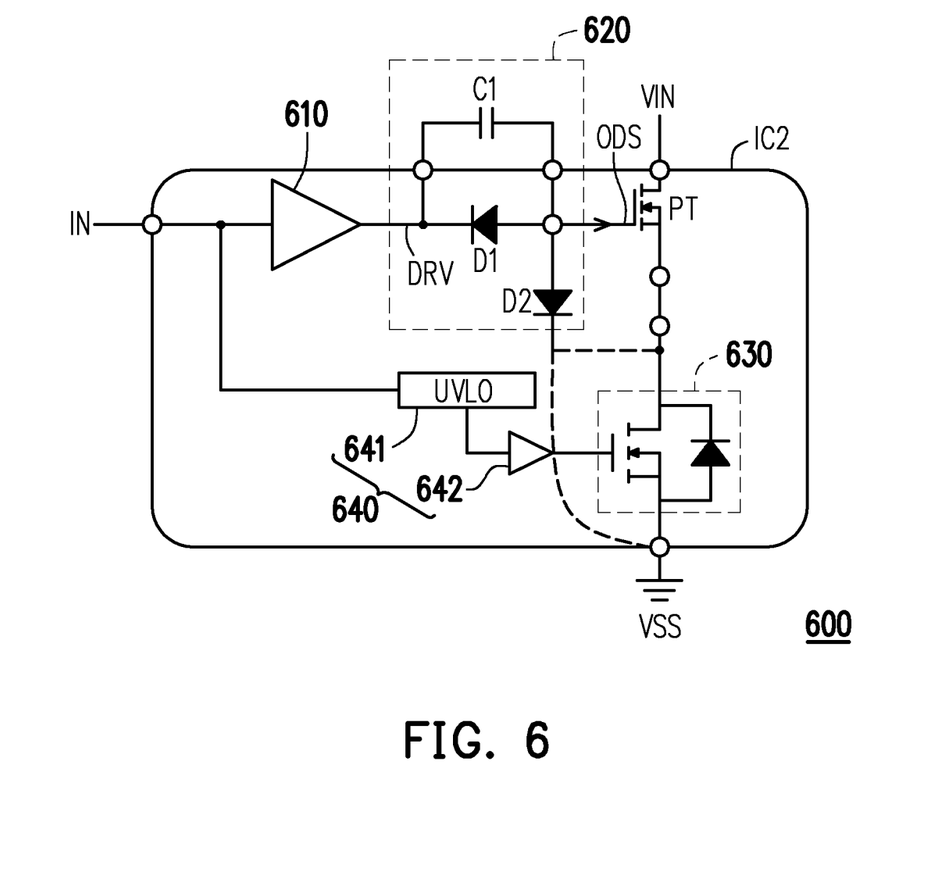

Please refer to FIG. 6, which illustrates a schematic diagram of a driving circuit according to another embodiment of present disclosure. The driving circuit 600 includes a driving signal generator 610, a voltage conversion circuit 620, a switch 630 and an enable signal generator 640. Different from the driving circuit 500, the voltage conversion circuit 620 includes a capacitor C1 and two diodes D1 and D2. The capacitor C1 is coupled between the driving signal generator 610 and a control terminal of a power transistor PT. A cathode end of the diode D1 is coupled to an output end of the driving signal generator 610, and an anode end of the diode D1 is coupled to the control terminal of the power transistor PT. An anode end of the diode D2 is coupled to the control terminal of the power transistor PT, and a cathode end of the diode D2 is coupled to a coupling end of the power transistor PT and the switch 630 or coupled to a reference ground voltage VSS.

Corresponding to a rising edge of the input signal IN, the voltage conversion circuit 620 may perform a charging operation on the capacitor C1 according to a rising edge of a driving signal DRY. Corresponding to a falling edge of the input signal IN, the voltage conversion circuit 620 may perform a discharging operation on the capacitor C1 through the diodes D1 and D2 to pulled down a voltage level of an output driving signal ODS to a negative voltage. Such as that, the power transistor PT can be cut-off.

Also, in this embodiment, the capacitor C1 can be disposed external from a integrate circuit IC2, and other components of the driving circuit 600 and the power transistor PT cane be disposed in the integrated circuit IC2.

In this embodiment, the enable signal generator 640 includes a undervoltage-lockout (UVLO) circuit 641 and a buffer 642. The UVLO circuit 641 receives the input signal IN and decides whether the driving circuit 600 is in a standby state or not by detecting a voltage level of the input signal IN is abnormal or not. The UVLO circuit 641 provides an enable signal through the buffer to cut-off the switch 630 if the driving circuit 600 is in the standby state, and provides the enable signal through the buffer to turn-on the switch 630 if the driving circuit 600 is in an operation state.

Figure 7A:
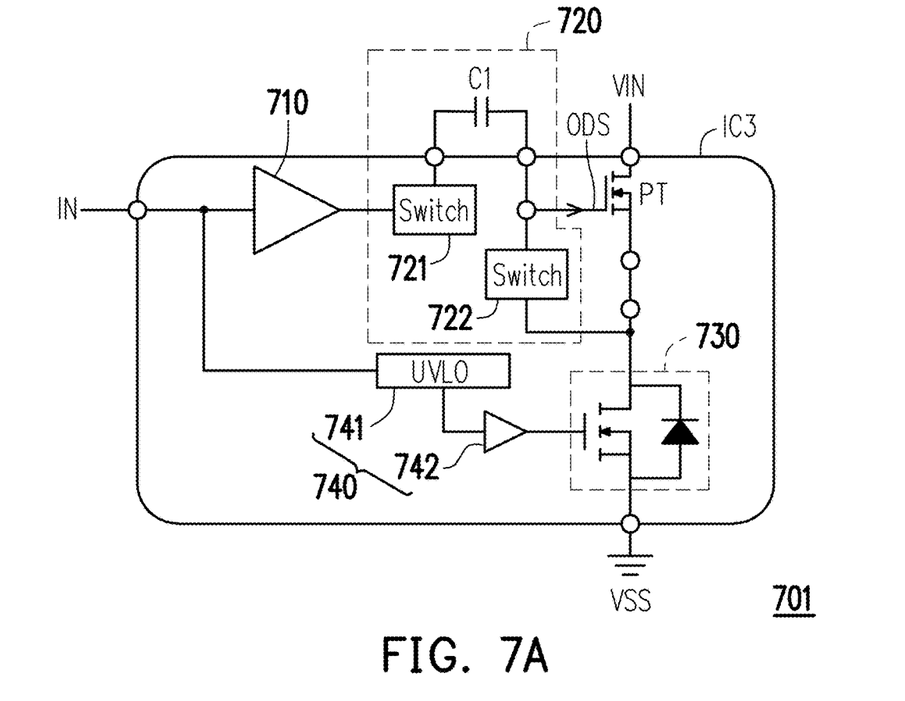

Please refer to FIG. 7A, which illustrates a schematic diagram of a driving circuit according to another embodiment of present disclosure. The driving circuit 701 includes a driving signal generator 710, a voltage conversion circuit 720, a switch 730 and an enable signal generator 740. Different from the driving circuits 500 and 600, the voltage conversion circuit 720 includes a capacitor C1 and two switches 721 and 722. The capacitor C1 is coupled between the driving signal generator 610 through the switch 721 and a control terminal of a power transistor PT. The switch 721 is coupled between the capacitor C1 and an output end of the driving signal generator 710. The switch 722 is coupled between the control terminal of the power transistor PT and a coupling end of the power transistor PT and the switch 730.

In operation, the switch 721 can be turned-on to form a charging path for performing charging operation on the capacitor C1 if the input signal IN is transited from a low voltage to a high voltage. If the input signal IN is transited from the high voltage to the low voltage, the switch 722 can be turned-on and forms a discharging path for performing discharging operation on the capacitor C1. According to the charging and discharge operations, an output driving signal ODS can be pulled to a negative voltage to cut-off the power transistor PT.

The enable signal generator 740 includes a undervoltage-lockout (UVLO) circuit 741 and a buffer 742. Operations of the enable signal generator 740 is similar to the enable signal generator 640 and no more repeated description here.

It should be noted here, the switches 721 and 722 can be implemented by any semiconductor devices which can behave as a switch, such as transistors, and no more special limitation here.

Also, in this embodiment, the capacitor C1 may be disposed external from an integrated circuit IC3, and other components of the driving circuit 701 and the power transistor PT can be disposed in the same integrated circuit IC3.

Figure 7B:
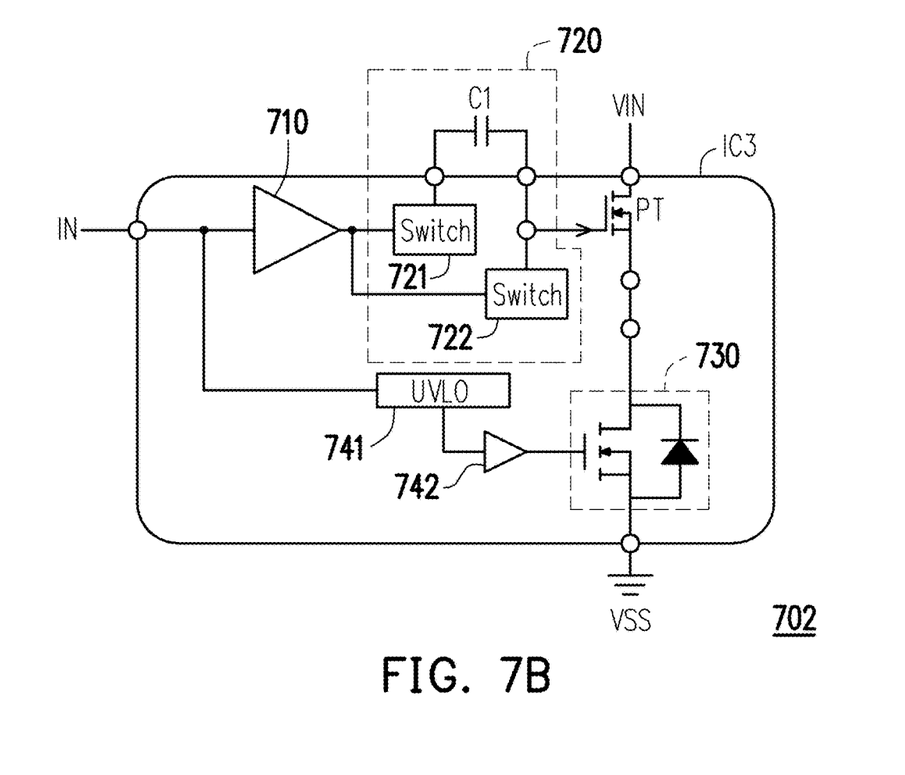

Please refer to FIG. 7B, which illustrates a schematic diagram of a driving circuit according to another embodiment of present disclosure. The driving circuit 702 includes same electronic components as the driving circuit 701. Different from the driving circuit 701 the switch 722 of the voltage conversion circuit 720 is coupled between the output end of the driving signal generator 710 and the control terminal of the power transistor PT. The switch 722 is used to provide the discharging path for the discharging operation for the capacitor C1 in response to the falling edge of the input signal IN.

Figure 8:
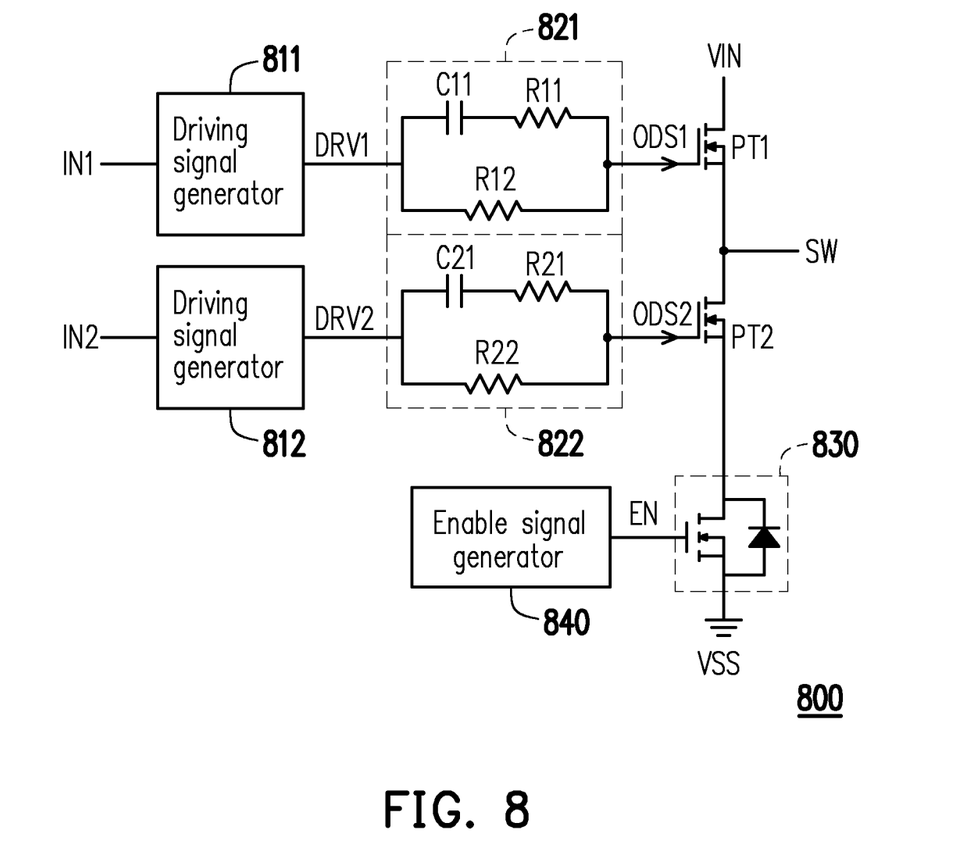

Please refer to FIG. 8 which illustrates a schematic diagram of a driving circuit according to another embodiment of present disclosure. The driving circuit 800 includes driving signal generators 811 and 812, voltage conversion circuits 821 and 822, a switch 830 and an enable signal generator 840. The driving signal generators 811 and 812 respectively receive input signals IN1 and IN2, and the driving signal generators 811 and 812 respectively generate driving signals DRV1 and DRV2 according to the input signals IN1 and IN2, respectively. The voltage conversion circuits 821 and 822 are respectively coupled to the driving signal generators 811 and 812. The voltage conversion circuits 821 and 822 convert the driving signals DRV1 and DRV2 to respectively generate output driving signals ODS1 and ODS2. The output driving signals ODS1 and ODS2 are respectively provided to control terminals of power transistors PT1 and PT2. Each of the power transistors PT1 and PT2 can be turned-on or cut-off according to each of the output driving signals ODS1 and ODS2.

In this embodiment, the power transistors PT1 and PT2 and the switch 830 are coupled in series between a receiving power VIN and a reference ground voltage VSS.

The switch 830 is controlled by an enable signal EN, and the enable signal EN is generated by the enable signal generator 840. When the driving circuit 800 is in a standby state, the switch 830 can be cut-off, and when the driving circuit 800 is in an operation state, the switch 830 can be turned-on.

In detail, the voltage conversion circuit 821 may include a capacitor C11 and resistors R11 and R12. The voltage conversion circuit 822 may include a capacitor C21 and resistors R21 and R22. Each of the voltage conversion circuits 821 and 822 has same circuit structure as the voltage conversion circuits 220 in FIG. 2. Detail operations of each of the voltage conversion circuits 821 and 822 can be refer to the description mentioned above in the embodiment about FIG. 2, and no more repeated description here.

In this embodiment, the input signals IN1 and IN2 may be same or different, and no limitation here. Each of the power transistors PT1 and PT2 can be controlled to be turned-on or cut-off individually.

Figure 9:
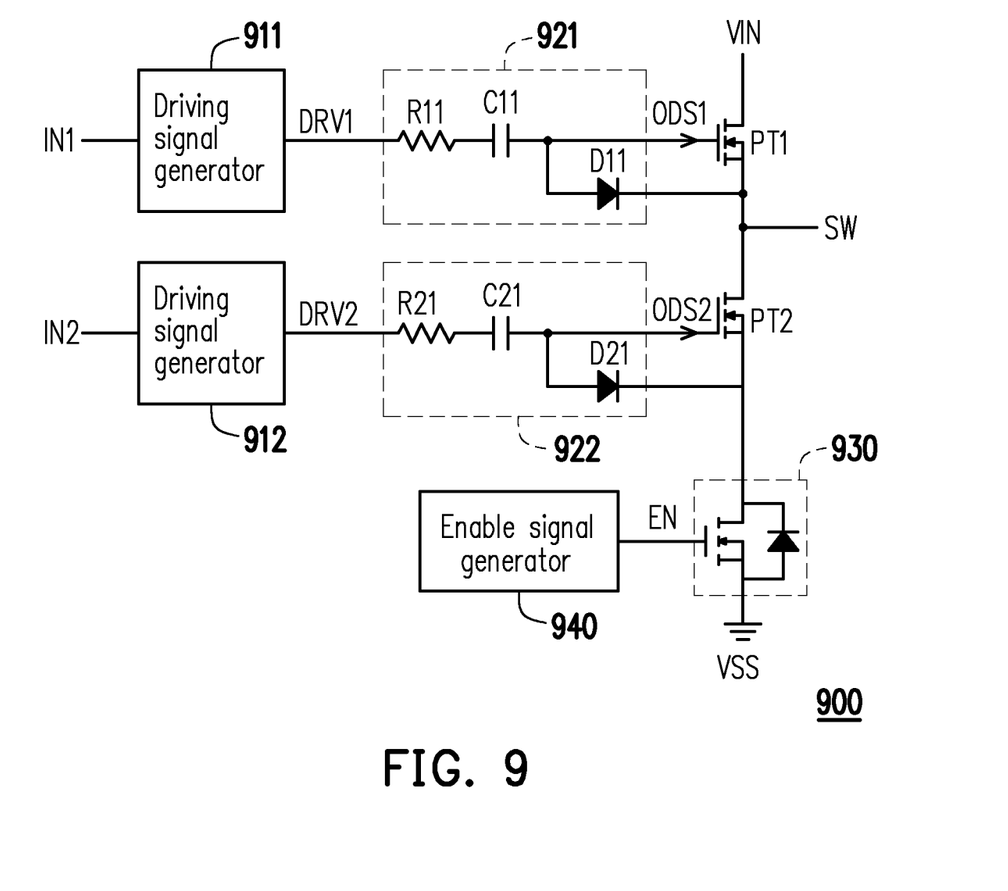

Please refer to FIG. 9 which illustrates a schematic diagram of a driving circuit according to another embodiment of present disclosure. The driving circuit 900 includes driving signal generators 911 and 912, voltage conversion circuits 921 and 922, a switch 930 and an enable signal generator 940. The driving signal generators 911 and 912 respectively receive input signals IN1 and IN2, and the driving signal generators 911 and 912 respectively generate driving signals DRV1 and DRV2 according to the input signals IN1 and IN2, respectively. The voltage conversion circuits 921 and 922 are respectively coupled to the driving signal generators 911 and 912. The voltage conversion circuits 921 and 922 convert the driving signals DRV1 and DRV2 to respectively generate output driving signals ODS1 and ODS2. The output driving signals ODS1 and ODS2 are respectively provided to control terminals of power transistors PT1 and PT2. Each of the power transistors PT1 and PT2 can be turned-on or cut-off according to each of the output driving signals ODS1 and ODS2.

In this embodiment, the power transistors PT1 and PT2 and the switch 930 are coupled in series between a receiving power VIN and a reference ground voltage VSS.

The switch 930 is controlled by an enable signal EN, and the enable signal EN is generated by the enable signal generator 940.

In detail, the voltage conversion circuit 921 may include a resistor R11, a capacitor C11 and a diode D11. The voltage conversion circuit 922 may include a resistor R21, a capacitor C21 and a diode D21. Each of the voltage conversion circuits 921 and 922 has same circuit structure as the voltage conversion circuits 420 in FIG. 4. Detail operations of each of the voltage conversion circuits 921 and 922 can be refer to the description mentioned above in the embodiment about FIG. 4, and no more repeated description here.

In this embodiment, the input signals IN1 and IN2 may be same or different, and no limitation here. Each of the power transistors PT1 and PT2 can be controlled to be turned-on or cut-off individually.

Figure 10:
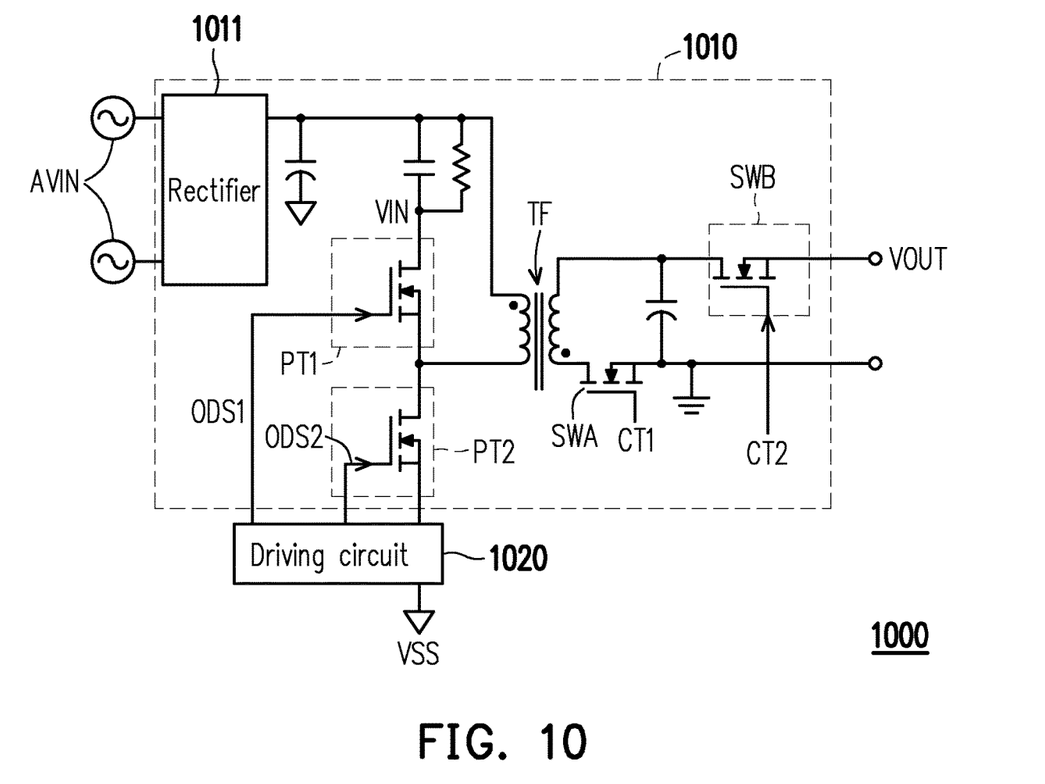
FIG. 10 illustrates a schematic diagram of an electronic device according to an embodiment of present disclosure.

Please refer to FIG. 10, which illustrates a schematic diagram of an electronic device according to an embodiment of present disclosure. The electronic device 1000 includes a core circuit 1010 and a driving circuit 1020. The core circuit 1010 is coupled to the driving circuit 1020. The electronic device 1000 is an active fly-back (ACF) circuit with half-bridge rectifier. The core circuit 1010 includes a rectifier 1011, power transistors PT1 and PT2, a transformer TF, two transistor switches SWA and SWB and a plurality of passive electronic components. The power transistors PT1 and PT2 are coupled in series between a receiving power VIN and a reference ground voltage VSS, and the power transistors PT1 and PT2 are controlled by output driving signals ODS1 and ODS2 which are generated by the driving circuit 1020. Each of the power transistors PT1 and PT2 can be turned-on or cut-off alternatively according to the output driving signals ODS1 and ODS2 to perform a voltage conversion operation. The implementation of the driving circuit 1020 can be refer to any one of the driving circuits of presented embodiment mentioned above, and no repeated description here.

On a second side of the transformer TF, there are two transistor switches SWA and SWB which are respectively controlled by control signals CT1 and CT2. An output voltage VOUT can be generated by converting an input power ACIN in the voltage conversion operation.

Figure 11:
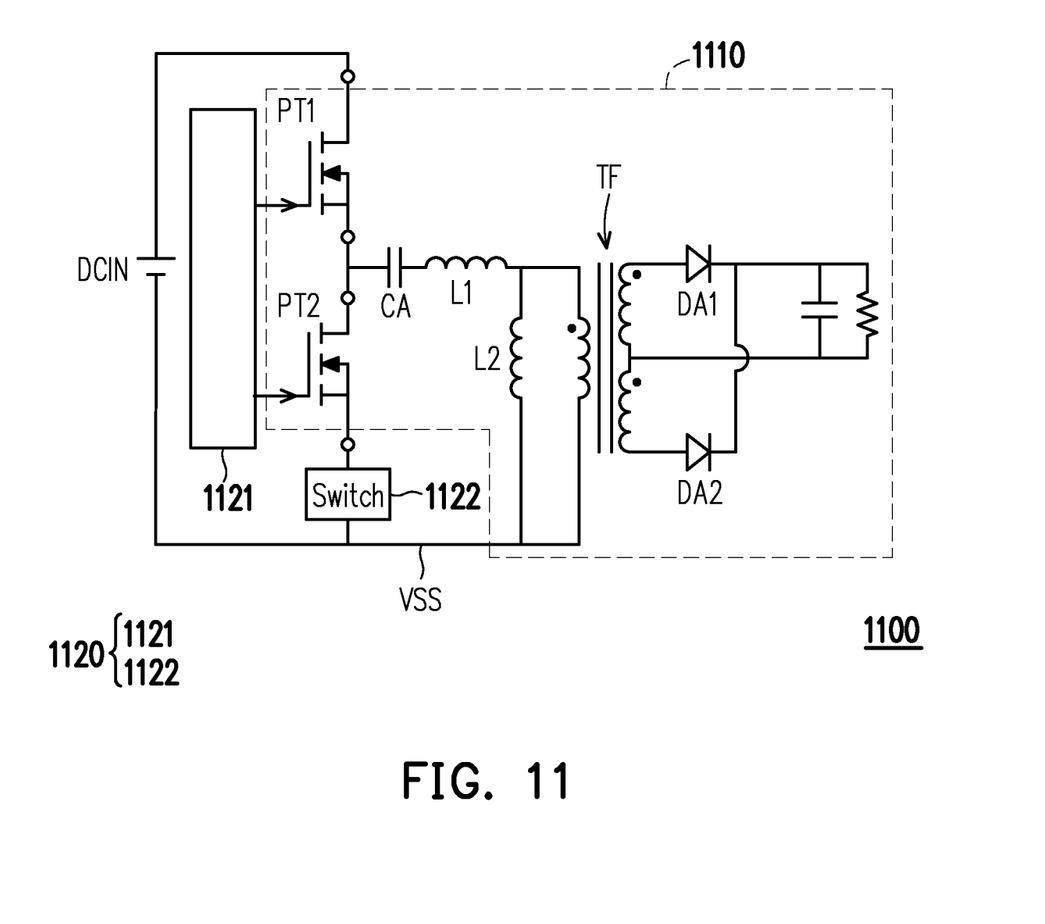
FIG. 11 to FIG. 14 illustrate schematic diagrams of electronic devices according to other embodiments of present disclosure.

Please refer to FIG. 11, which illustrates a schematic diagram of an electronic device according to another embodiment of present disclosure. The electronic device 1100 includes a core circuit 1110 and a driving circuit 1120. The driving circuit 1120 includes a driving signal generator and voltage conversion circuit 1121 and a switch 1122. The core circuit 1110 is coupled to the driving circuit 1120. The electronic device 1100 is an LLC (two inductors and one capacitor) resonant circuit with half-bridge rectifier. The core circuit 1110 includes inductors L1, L2, capacitor CA to form an LLC structure. The core circuit 1110 further includes power transistors PT1 and PT2, a transformer TF and diodes DA1 and DA2. The core circuit 1110 is used to convert an input power DCIN according to a switching operation by the power transistors PT1 and PT2, and the diodes DA1 and DA2 form a half-bridge rectifier to generate an output power.

The power transistors PT1 and PT2 are controlled by the driving signal generator and voltage conversion circuit 1121. The driving signal generator and voltage conversion circuit 1121 may include two driving signal generators and two voltage conversion circuits. Detail of each of the driving signal generators and each of the voltage conversion circuits can be refer to the embodiments mentioned above. The power transistors PT1 and PT2 and the switch 1122 are coupled in series between the input power DCIN (the receiving power) and a reference ground voltage VSS.

Figure 12:
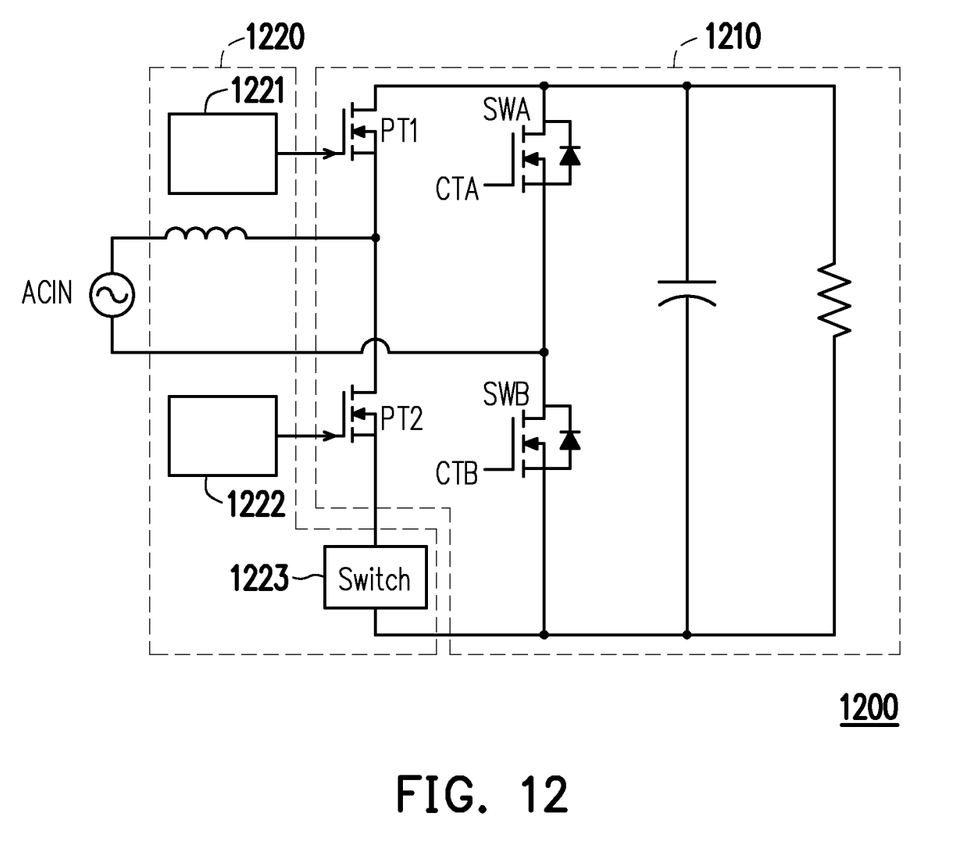

Please refer to FIG. 12, which illustrates a schematic diagram of an electronic device according to another embodiment of present disclosure. The electronic device 1200 includes a core circuit 1210 and a driving circuit 1220. The driving circuit 1220 includes two driving signal generator and voltage conversion circuits 1221 and 1222 and a switch 1223. The core circuit 1210 is coupled to the driving circuit 1220. The electronic device 1200 is a totem-pole power factor correlation (PFC) circuit with half-bridge rectifier. The core circuit 1210 includes power transistors PT1 and PT2 and two transistor switches SWA and SWB. The transistor switches SWA and SWB are respectively controlled by control signals CTA and CTB. The power transistors PT1 and PT2 are respectively controlled by the driving signal generator and voltage conversion circuits 1221 and 1222. The power transistors PT1 and PT2 and the switch 1223 are coupled in series. The transistor switches SWA and SWB and the power transistors PT1 and PT2 can be used to form an active rectifier to rectify an input power ACIN to a direct current (DC) output voltage.

Each of the driving signal generator and voltage conversion circuits 1221 and 1222 may include one driving signal generator and one voltage conversion circuit, and details of the driving signal generator and the voltage conversion circuit can refer to the embodiments mentioned above, and no more repeated description here.

Figure 13:
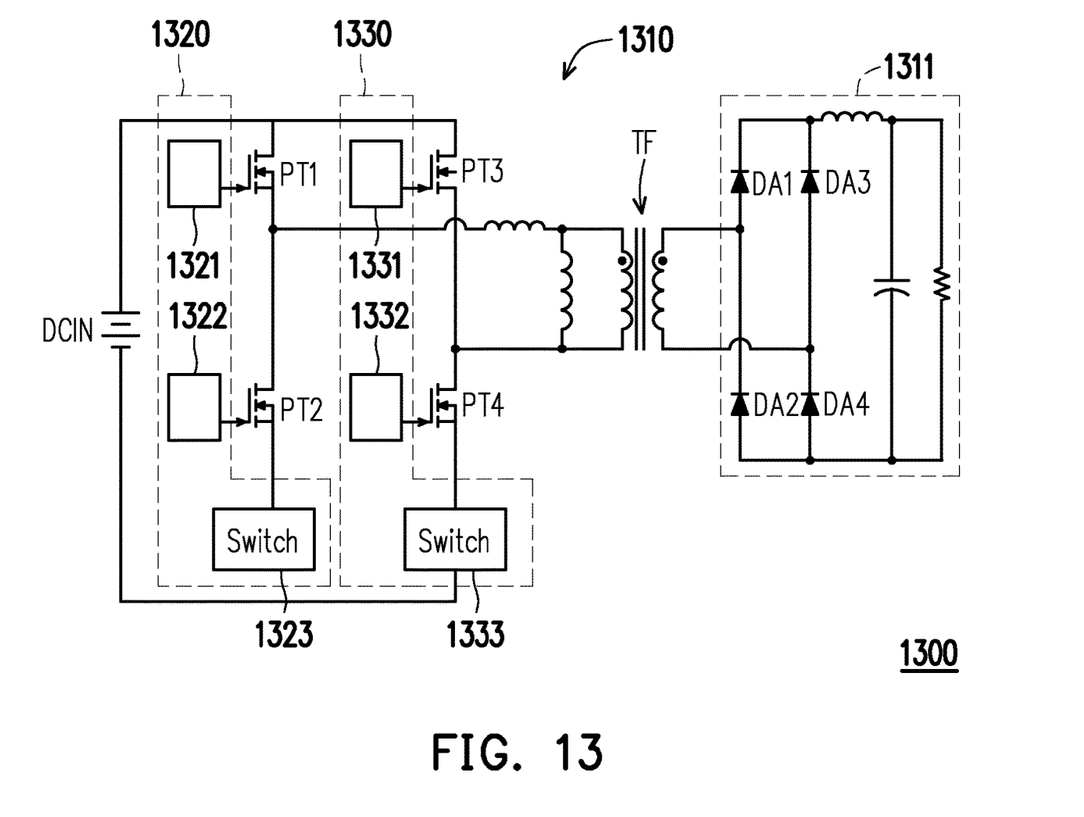

Please refer to FIG. 13, which illustrates a schematic diagram of an electronic device according to another embodiment of present disclosure. The electronic device 1300 includes a core circuits 1310, and two driving circuits 1320 and 1330. The driving circuit 1320 includes two driving signal generator and voltage conversion circuits 1321 and 1322 and a switch 1323. The driving circuit 1330 includes two driving signal generator and voltage conversion circuits 1331 and 1332 and a switch 1333. The core circuit 1310 is coupled to the driving circuits 1320 and 1330. The electronic device 1300 is a phase-shifted full-bridge (PSFB) converter with half-bridge rectifier.

The core circuit 1310 includes power transistors PT1 to PT4, a transformer TF and a rectifier 1311. The power transistors PT1 and PT2 form a first rectifying phase and the power transistors PT3 and PT4 form a second rectifying phase. The power transistors PT1 to PT4 are disposed in a first side of the transformer TF, and are respectively controlled by the driving signal generator and voltage conversion circuits 1321, 1322, 1331 and 1332. On the other hand, the rectifier 1311 includes diodes DA1 to DA4 to form a bridge rectifier.

Each of the driving signal generator and voltage conversion circuits 1321, 1322, 1331 and 1332 may include one driving signal generator and one voltage conversion circuit, and details of the driving signal generator and the voltage conversion circuit can refer to the embodiments mentioned above, and no more repeated description here.

Each of the power transistors PT1 and PT2 are turned-on or cut-off alternatively according to the driving signal generator and voltage conversion circuits 1321 and 1322. Each of the power transistors PT3 and PT4 are turned-on or cut-off alternatively according to the driving signal generator and voltage conversion circuits 1331 and 1332. The power transistors PT1 to PT4 are used to convert an input power DCIN to an alternative current (AC) output power. The transform TF can transform the AC output power to the rectifier 1311, and an DC output power can be generated by the rectifier 1311.

Figure 14:
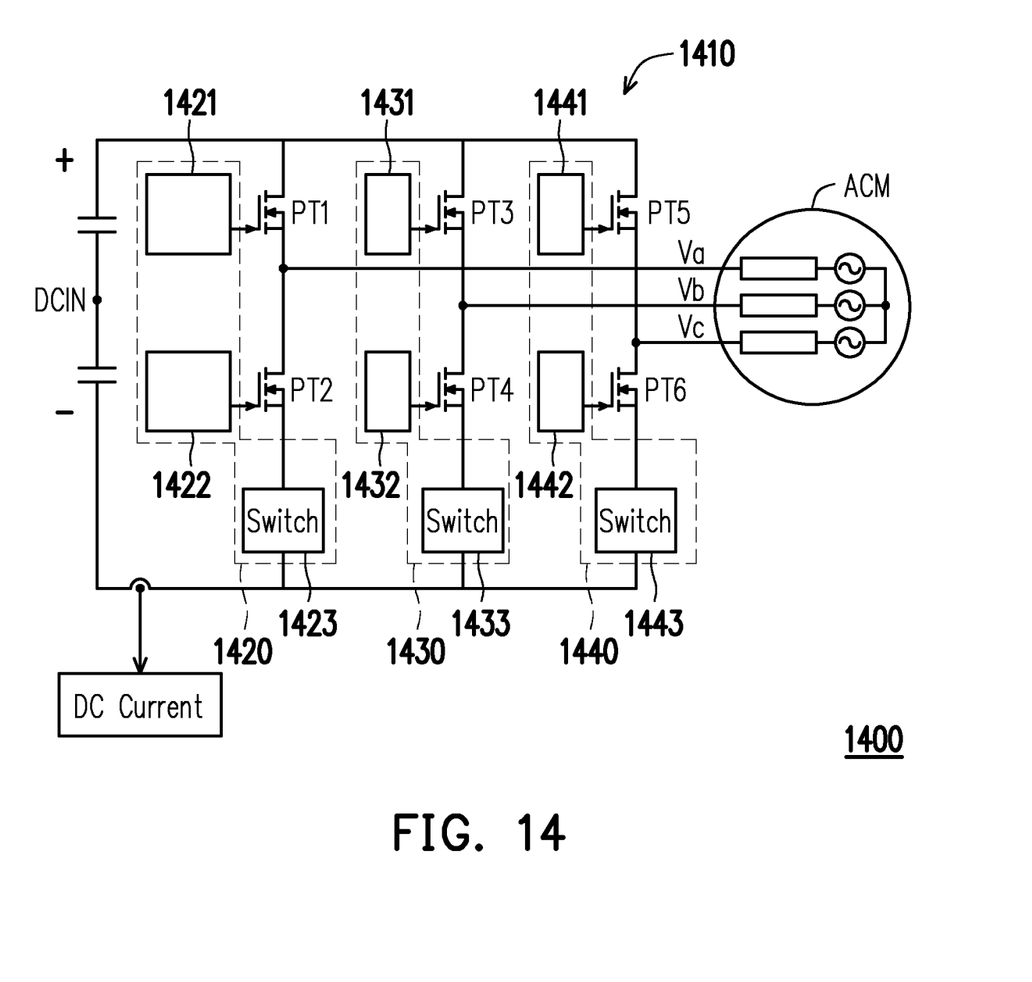

Please refer to FIG. 14, which illustrates a schematic diagram of an electronic device according to another embodiment of present disclosure. The electronic device 1400 includes a core circuits 1410, and three driving circuits 1420, 1430 and 1440. The driving circuit 1420 includes two driving signal generator and voltage conversion circuits 1421 and 1422 and a switch 1423. The driving circuit 1430 includes two driving signal generator and voltage conversion circuits 1431 and 1432 and a switch 1433. The driving circuit 1440 includes two driving signal generator and voltage conversion circuits 1441 and 1442 and a switch 1443. The core circuit 1410 is coupled to the driving circuits 1420, 1430 and 1440. The electronic device 1400 is a voltage inverter for a motor with half-bridge rectifier.

The core circuit 1410 includes power transistors PT1 to PT6. The power transistors PT1 and PT2, PT3 and PT4, PT5 and PT6 respectively form driving circuit with different phases for driving a AC motor ACM. The power transistors PT1 to PT6 are respectively controlled by the driving circuits 1420, 1430 and 1440 to convert an input power DCIN to generate three phase voltages Va, Vb and Vc. Two of the phase voltages Va, Vb and Vc may have a phase difference with 120 degrees.

Each of the driving signal generator and voltage conversion circuits 1421, 1422, 1431 1432, 1441 and 1442 may include one driving signal generator and one voltage conversion circuit, and details of the driving signal generator and the voltage conversion circuit can refer to the embodiments mentioned above, and no more repeated description here.

In summary, the present disclosure provides a driving circuit has a voltage conversion circuit, and the voltage conversion circuit is configured to generate an output driving signal with a negative voltage by converting the driving signal. Such as that, the power transistor can be cut-off efficiency by the negative voltage of the output driving signal.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A driving circuit, comprising:
a first driving signal generator, generating a first driving signal according a first input signal, wherein the first driving signal is a pulse width modulated signal;
a first voltage conversion circuit, coupled between the first driving signal generator and a control terminal of a first power transistor, and converting the first driving signal to an output driving signal by charging a capacitor and discharging the capacitor, wherein the output driving signal is output to the control terminal of the first power transistor; and
a first switch, couple with the first power transistor in series, and being controlled by a control signal to be turned-on or cut-off,
wherein the first voltage conversion circuit comprises:
a second switch, having a first end coupled to an output end of the first driving signal generator and a second end coupled to one end of the capacitor, and providing a charging path for a charging operation for the capacitor; and a third switch, having a first end coupled to the output end of the first driving signal generator and a second end coupled to the other end of the capacitor and the control terminal of the first power transistor, and providing a discharging path for a discharging operation for the capacitor.

2. The driving circuit as claimed in claim 1, wherein a voltage range of the first driving signal is positive voltage and a voltage range of the output driving signal is negative voltage.

3. The driving circuit as claimed in claim 1, wherein a turn-on and cut-off status of the second switch is complementary to a turn-on and cut-off status of the third switch.

4. The driving circuit as claimed in claim 1, further comprising:

an enable signal generator, coupled to the first switch, generating an enable signal to control a turned-on or cut-off status of the first switch according to the first input signal.

5. The driving circuit as claimed in claim 4, wherein the enable signal generator is a undervoltage-lockout (UVLO) circuit.

6. The driving circuit as claimed in claim 1, wherein the first driving signal generator, the first voltage conversion circuit and the first switch are integrated in a same chip.

7. An electronic device, comprising:
a core circuit, comprising a first power transistor;
at least one driving circuit, comprising:
a first driving signal generator, generating a first driving signal according a first input signal;
a first voltage conversion circuit, coupled between the first driving signal generator and a control terminal of the first power transistor, and converting the first driving signal to an output driving signal by charging a capacitor and discharging the capacitor, wherein the output driving signal is output to the control terminal of the first power transistor; and
a first switch, couple with the first power transistor in series, and being controlled by a control signal to be turned-on or cut-off,
wherein the first power transistor is a third-generation semiconductor device, and
wherein the first voltage conversion circuit comprises:
a second switch, having a first end coupled to an output end of the first driving signal generator and a second end coupled to one end of the capacitor, and providing a charging path for a charging operation for the capacitor; and
a third switch, having a first end coupled to the output end of the first driving signal generator and a second end coupled to the other end of the capacitor and the control terminal of the first power transistor, and providing a discharging path for a discharging operation for the capacitor.

8. The electronic device as claimed in claim 7, wherein the core circuit is a voltage conversion circuit or a power factor controlling circuit.

9. A driving circuit, comprising:
a first driving signal generator, generating a first driving signal according a first input signal, wherein the first driving signal is a pulse width modulated signal;
a first voltage conversion circuit, coupled between the first driving signal generator and a control terminal of a first power transistor, and converting the first driving signal to an output driving signal by charging a capacitor and discharging the capacitor, wherein the output driving signal is output to the control terminal of the first power transistor; and
a first switch, coupled with the first power transistor in series, and being controlled by a control signal to be turned-on or cut-off,
wherein the first voltage conversion circuit comprises:
a second switch, having a first end coupled to an output end of the first driving signal generator and a second end coupled to one end of the capacitor, and providing a charging path for a charging operation for the capacitor; and
a third switch, having a first end coupled to the other end of the capacitor and the control terminal of the first power transistor and a second end coupled to a coupling end of the first power transistor and the first switch, and providing a discharging path for a discharging operation for the capacitor.

10. An electronic device, comprising:
a core circuit, comprising a first power transistor;
at least one driving circuit, comprising:
a first driving signal generator, generating a first driving signal according a first input signal;
a first voltage conversion circuit, coupled between the first driving signal generator and the control terminal of the first power transistor, and converting the first driving signal to an output driving signal by charging a capacitor and discharging the capacitor, wherein the output driving signal is output to the control terminal of the first power transistor; and
a first switch, coupled with the first power transistor in series, and being controlled by a control signal to be turned-on or cut-off,
wherein the first power transistor is a third-generation semiconductor device, and
wherein the first voltage conversion circuit comprises:
a second switch, having a first end coupled to an output end of the first driving signal generator and a second end coupled to one end of the capacitor, and providing a charging path for a charging operation for the capacitor; and
a third switch, having a first end coupled to the other end of the capacitor and the control terminal of the first power transistor and a second end coupled to a coupling end of the first power transistor and the first switch, and providing a discharging path for a discharging operation for the capacitor.

* * * * *